United States Patent
Mullarkey et al.

[19]

[11] Patent Number: 6,075,737
[45] Date of Patent: Jun. 13, 2000

[54] ROW DECODED BIASING OF SENSE AMPLIFIER FOR IMPROVED ONE'S MARGIN

[75] Inventors: Patrick J. Mullarkey; Scott J. Derner, both of Meridian, Id.

[73] Assignee: Micron Technology, Inc., Boise, Id.

[21] Appl. No.: 09/204,112

[22] Filed: Dec. 2, 1998

[51] Int. Cl.$^7$ .................................................. G11C 7/02

[52] U.S. Cl. .......................... 365/207; 365/205; 365/206; 365/190; 365/226

[58] Field of Search .............................. 365/189.01, 205, 365/206, 207, 190, 226

[56] References Cited

U.S. PATENT DOCUMENTS

| | | | |
|---|---|---|---|
| 4,799,194 | 1/1989 | Arakawa | 365/154 |
| 5,627,789 | 5/1997 | Kalb, Jr. | 365/205 |
| 5,732,033 | 3/1998 | Mullarkey et al. | 365/201 |
| 5,848,011 | 12/1998 | Muraoka et al. | 365/207 |
| 5,862,089 | 1/1999 | Raad et al. | 365/203 |
| 5,880,989 | 3/1999 | Wilson et al. | 365/145 |
| 5,892,728 | 4/1999 | Allen et al. | 365/230.06 |
| 5,903,502 | 5/1999 | Porter | 365/201 |

*Primary Examiner*—Viet Q. Nguyen
*Attorney, Agent, or Firm*—Schwegman, Lundberg, Woessner & Kluth, P.A.

[57] ABSTRACT

A structure and method to improve sense amplifier operation in memory circuits is provided. An illustrative method of the present invention includes taking the predecoded the row address signals (i.e. RA123<n>, LPHe<n>, LPHo<n>) that run down the rowdriver seams in a memory array (peripheral circuitry), and decoding those address signals in the sense amplifier gaps. The decoding is done to fire a signal that runs up the sense amplifier gap and biases the sense amplifier to fire in one direction or the other. Exemplary embodiments of the present invention are as follows. One method of the present invention includes putting two small n-channel transistors in parallel with each of the cross-coupled n-channel transistors in the n-sense amplifier. The gates of the two small n-channel transistors are initially low. Then, depending on the intended direction for biasing the sense amplifier, the gate of one of the small n-channel transistors would go to DVC2 until the p-sense amplifier fires. The reference digitline (DIG*) coupled in parallel with the fired small n-channel is pulled to ground harder, or assisted to ground faster than the other digitline (DIG) with the effect of favoring a "sensed" logical "1" on the latter. The biasing of the sense amplifier is set so that a zero can still be read out correctly. In result, where a detected signal voltage difference between the digitline (DIG) and the reference digitline (DIG*) is small, e.g., to the point where a normal sense amplifier will read either toward a logical "1" or a logical "0," the biasing will cause the sense amplifier to read a logical "1".

A second method of the present invention includes using two separate n-sense amplifier bus lines (RNL*s) in each individual sense amplifier gap. One n-sense amplifier bus line (RNL*) is connected to each of the cross-coupled n-channel transistors in the n-sense amplifier. One of the separate n-sense amplifier bus lines (RNL*s) is biased greater than the other. When the n-sense amplifier fires, the digitline (DIG) favors sensing a logical "1".

32 Claims, 12 Drawing Sheets

ROW DECODED BIASING OF SENSE AMPLIFIER FOR IMPROVED ONE'S MARGIN

FIELD OF THE INVENTION

The present invention relates generally to semiconductor integrated circuits. More particularly, it pertains to structure and method for row decoded biasing of sense amplifiers for improved one's margin.

BACKGROUND OF THE INVENTION

Modern electronic systems typically include a data storage device such as a dynamic random access memory (DRAM), static random access memory (SRAM) or other conventional memory device. The memory device stores data in vast arrays of memory cells. Each cell conventionally stores a single bit of data (a logical "1" or a logical "0") and can be individually accessed or addressed. Data is output from a memory cell during a "read" operation, and data is stored into a memory cell during a "write" operation.

In a standard read or write operation, a column decoder and a row decoder translate address signals into a single intersection of a row (wordline) and column (digitline, or bitline) within the memory array. This function permits the memory cell at that location to be read from or for data to be placed into that cell. The processing of data is dependent on the time it takes to store or retrieve individual bits of data in the memory cells. Storing and retrieving the bits of data is controlled generally by a microprocessor, whereby data is passed to and from the memory array through a fixed number of input/output (I/O) lines and I/O pins. According to current processing technology the accuracy of sensing data is further dependent on the magnitude of charge stored in a memory cell and the capacitance inherent in the integrated circuit. Typically a logical "1" is stored in a memory cell as Vcc on a storage node side of a capacitor with a potential of Vcc/2 on the common plate of the memory cell capacitor. The capacitor is on the order of 25 femto Farads (fF). When reading the "1" from the capacitor the row line turns on the access transistor between the storage node side of the capacitor and the digit line. The digit line was precharged to Vcc/2 and has a capacitance on the order of 150 to 200 fF. The charge from the storage node dumps onto the digit line and brings its voltage up slightly above the equilibrate level of Vcc/2. Here, +Vcc/2 means a voltage signal slightly greater than Vcc/2, e.g. Vcc/2 plus 50 mV. The reason that the cell only brings the digit up slightly is because of the digit lines large capacitance with respect to the cell. Or to put it another way, the same charge that gets the storage node of the cell to Vcc can only move the digit lines slightly above their equilibrate level of Vcc/2.

When looking at a "0" dumping onto a digitline the same principals apply. Even though the storage node side of the cell is at ground when the row line turns on the access gate to that cell, very little charge from the digitline is needed to get the digitline and cell at the same level. This new level is slightly lower than the digitline's equilibrated level of Vcc/2. In this case, −Vcc/2 will be a voltage signal which is slightly less than Vcc/2, e.g. Vcc/2 minus 50 mV.

A sense amplifier uses the difference between the digitline seeing the cell dump onto it versus the other digitline that remains at the equilibrated level to determine which line to pull up to Vcc and which one to pull down to ground. The accuracy of the sensing operation is thus dependent on the signal clarity between sensing 30 Vcc/2 and −Vcc/2.

The magnitude of charge required to store a logical "1," and the rate at which that charge has to be refreshed, contribute to additional operational burdens on the integrated circuit as a whole. Modem applications call on electronic systems to use less power and to process data at greater speeds. In order for electronic systems to meet to these demands, the sensing operation must advance in speed and accuracy.

One method to advance the sensing operation is to bias the sense amplifier in one direction or another, e.g., to favor reading a logical "1" over a logical "0." Normally, biasing of a sense amplifier is unintentional. When it occurs unintentionally, the sense amplifier affected will tend to fire in the same direction every time, which helps some of the bits on the column and hurts others. Since a logical "1" signal is sometimes weak, the sensing operation may misdetect an ambiguous logical "1" signal as a logical "0." To correct for such error, it is desirable to favor sensing a logical "1" over the sensing of a logical "0." This is done by increasing the signal response range for a logical "1." Commonly, this is referred to as trading the "zero's margin" for the "one's margin." One method of favoring logical "1" is by adjusting the digitline equilibrate level. However the equilibration time, which is known as tRP time, is getting too short to allow the digitlines to move from their initial equilibration of Vcc/2.

In example, during equilibration we first short digitline (DIG) and digitline* (DIG*) together. Since one was at Vcc and the other at ground, they both end up at Vcc/2. The digitlines need to be then supplied with a Vcc/2 voltage or they would eventually leak away to ground. This voltage however cannot be supplied directly to the digitlines because any row to column shorts would cause too much current during standby. To combat this effect, Vcc/2 is supplied through a long L n-channel which has high resistance and limits the amount of current that a row to column short can cause. The high resistance also means that it takes a while to get the digitlines to a voltage other than Vcc/2 during the equilibration time. Otherwise stated, it takes a while to get the digitlines to a voltage other than Vcc/2 before the next read in the same memory subarray occurs. This method of trading "zero's margin" for the "one's margin" is being abandoned for this reason. Also, adjusting Vcc/2 to other values causes the margin to vary with cycle time.

For the reasons stated above, and for other reasons stated below which will become apparent to those skilled in the art upon reading and understanding the present specification, it is desirable to develop better methods to improve the data sensing operation without an increase in the operational cycle times.

SUMMARY OF THE INVENTION

The above mentioned problems with the sense amplifier operation in memory circuits and other problems are addressed by the present invention and will be understood by reading and studying the following specification. A structure and method which accords improved benefits is provided.

In particular, an illustrative embodiment of the present invention includes taking the predecoded the row address signals (i.e. RA123<n>, LPHe<n>, LPHo<n>) that run down the rowdriver seams in a memory array (peripheral circuitry), and decoding those address signals in the sense amplifier gaps. The decoding is done to fire a signal that runs up the sense amplifier gap and biases the sense amplifier to fire in one direction or the other. Exemplary embodiments of the present invention are as follows. One method of the present invention includes putting two small n-channel transistors in parallel with each of the cross-coupled n-channel transistors in the n-sense amplifier. The gates of the two small n-channel transistors are initially low. Then, depending on the intended direction for biasing the sense amplifier, the gate of one of the small n-channel transistors would go to DVC2 until the p-sense amplifier fires. The reference digitline (DIG*) coupled in parallel with the fired small n-channel is pulled to ground harder, or assisted to ground faster than the other digitline (DIG) with the effect of favoring a "sensed" logical "1" on the latter. The biasing of the sense amplifier is set so that a zero can still be read out correctly. In result, where a detected signal voltage difference between the digitline (DIG) and the reference digitline (DIG*) is small, e.g., to the point where a normal sense amplifier will read either toward a logical "1" or a logical "0," the biasing will cause the sense amplifier to read a logical "1".

A second method of the present invention includes using two separate n-sense amplifier bus lines (RNL*s) in each individual sense amplifier gap. One n-sense amplifier bus line (RNL*) is connected to each of the cross couple n-channel transistors in the n-sense amplifier. One of the separate n-sense amplifier bus lines (RNL*s) is biased greater than the other. When the n-sense amplifier fires, the digitline (DIG) favors sensing a logical "1". In an exemplary embodiment, the two RNL*s run up the sense amplifier gap in a six square features ($6F^2$) memory cell layout architecture with vertical twist. In this layout, double twisted columns go to one sense amplifier gap and single twisted columns go to the other sense amplifier gap. Every sense amplifier in a particular gap gets connected up the same way. Only the local phase is needed to tell which digitline is getting the signal, or charge, and which is the reference digitline.

The improved structure and method provides a greater, or expanded, signal detection range representing a logical "1." In other words, the margin for detecting a logical "1," or "one's margin," is increased. A margin, or portion, of the signal detecting range traditionally allotted for logical "0" is required to expand the "one's margin." The expanded logical "1" signal detection range allows the voltage level in the "sensed" cell to fall as far down as the digitline equilibrated value of Vcc/2 (also referred to as DVC2) before it will fail to read out as a logical "1." However, the accuracy of detecting a logical "0" is not significantly restricted.

Another notable advantage to the present invention is that favoring a logical "1" in the sensing operation requires less charge to store a logical "1" in a memory cell. This helps to reduce the negative effects of capacitive coupling between the digitlines and other memory cells in the memory array.

Still another advantage of the present invention is that the circuit design reduces charge leakage rate to a logical "1" in the memory cell. To explain, logical "1's" do not normally leak away in a linear fashion. That is, as the voltage in the memory cell drops, the rate of leakage decreases. The improved sensing capability of the present invention allows a smaller voltage to be stored in individual memory cells and still obtain an accurate logical "1" detection. The slower rate of leakage in the DVC2 voltage range will also help improve, or increase, the logical "1s" refresh period. The refresh period is the amount of time between when a cell containing a logical "1" must be refreshed, to account for charge leakage. The required refresh period for a logical "0" on the typical cell is not affected much more than reading the zero with no refresh.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1A:
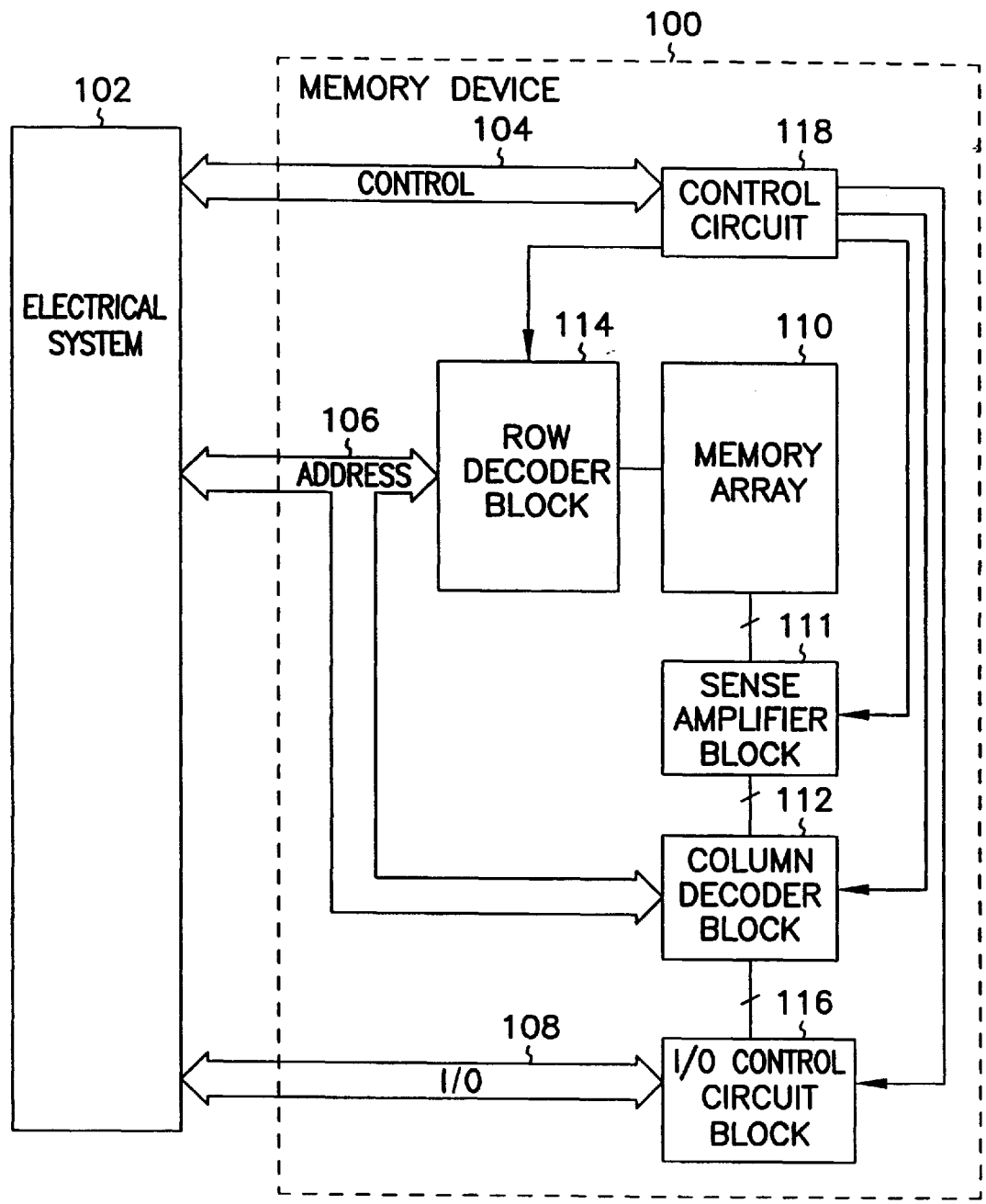
FIG. 1A is a block diagram illustrating an memory circuit according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Exemplary embodiments of the present invention are as follows. One method of the present invention includes putting two small n-channel transistors in parallel with each of the cross-coupled n-channel transistors in the n-sense amplifier. The gates of the two small n-channel transistors are initially low. Then, depending on the intended direction for biasing the sense amplifier, the gate of one of the small n-channel transistors would go to DVC2 until the p-sense amplifier fires. The biasing of the sense amplifier is set so that a zero can still be read out correctly. In result, where a detected signal voltage difference between the digitline (DIG) and the reference digitline (DIG*) is small, e.g., to the point where a normal sense amplifier will read either toward a logical "1" or a logical "0," the biasing will cause the sense amplifier to read a logical "1".

A second method of the present invention includes using two separate n-sense amplifier bus lines (RNL*s) in each individual sense amplifier gap. One of the separate n-sense amplifier bus lines (RNL*s) is connected to each of the cross couple n-channel transistors in the n-sense amplifier. One of the two n-sense amplifier bus lines (RNL*s) is biased greater than the other. When the n-sense amplifier fires, the digitline (DIG) favors sensing a logical "1". In an exemplary embodiment, the two RNL*s run up the sense amplifier gap in a six square features ($6F^2$) memory cell layout architecture with vertical twist. In this layout, double twisted columns go to one sense amplifier gap and single twisted columns go to the other sense amplifier gap. Every sense amplifier in a particular gap gets connected up the same way. Only the local phase is needed to tell which digitline is getting the signal, or charge, and which is the reference digitline.

FIG. 1A is a block diagram illustrating a memory circuit 100 according to the teachings of the present invention. FIG. 1A includes a memory array 110. The typical memory array 110 embodiment includes multiple rows of wordlines and multiple columns of bitlines. The intersection of the multiple rows of wordlines and multiple columns of bitlines serves as the location for multiple memory cells. The memory array 110 is coupled to a sense amplifier block, or circuit 111. The sense amplifier circuit is coupled to a column decoder block 112. The memory array 110 is coupled to a row decoder block 114. The column decoder block 112 is additionally coupled to an input/output (I/O) control circuit block 116. Address lines 106 run between the row decoder block 114, the column decoder block 112, and an electrical system 102. Control lines 104 run between the electrical system 102 and a control circuit 118. Input/output (I/O) lines 108 run, or couple between, the electrical system 102 and the I/O control circuit 116.

In one embodiment, the memory array 110 includes a dynamic random access memory (DRAM) array. Further, in one embodiment of the present invention, the memory array 110, or memory circuit 110, includes a memory cell layout architecture of eight square features ($8F^2$). In an alternative embodiment, the memory circuit 110 includes a memory cell layout architecture of six square features ($6F^2$).

Figure 1B:
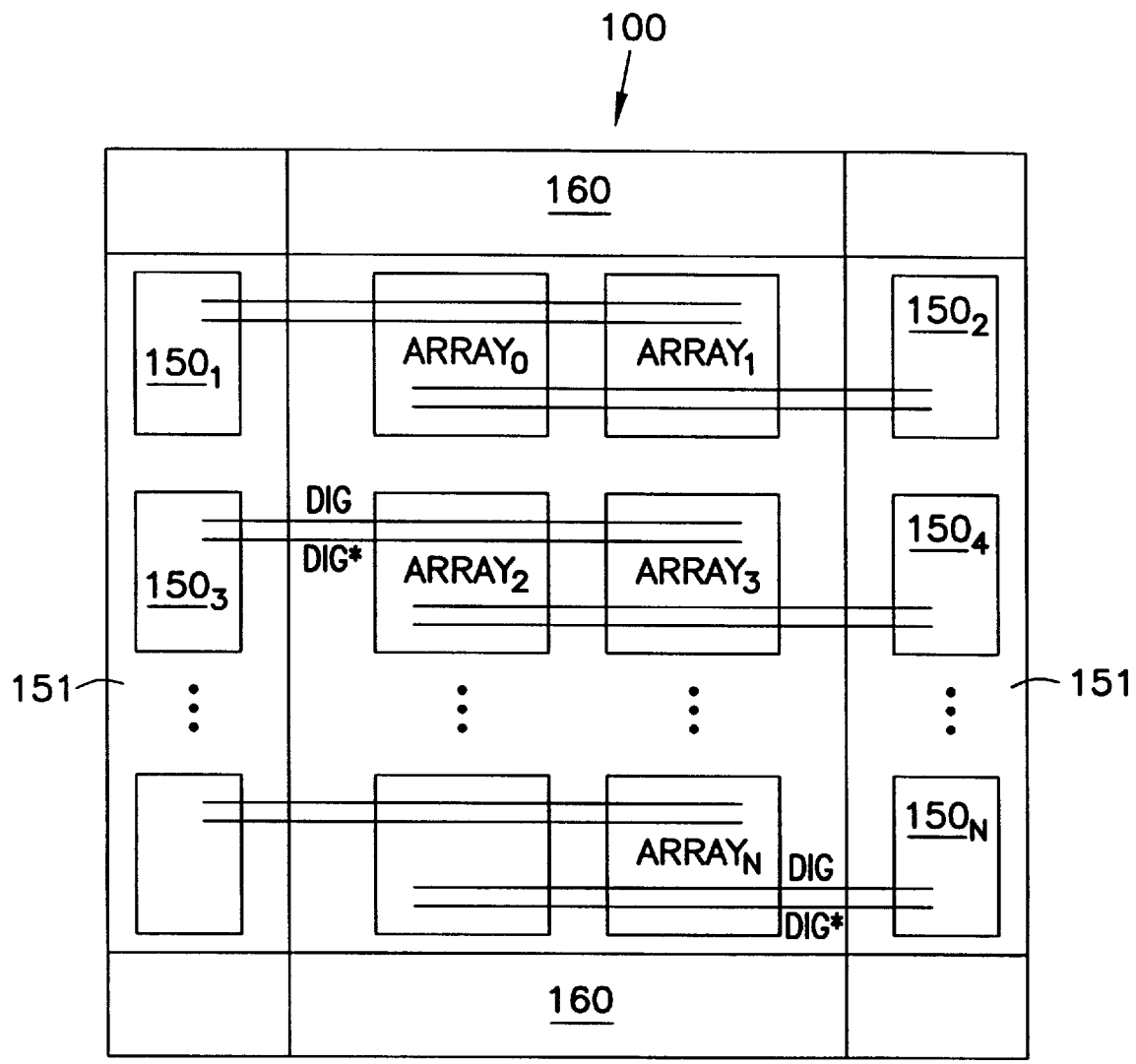
FIG. 1B is a block diagram illustrating in different detail a portion of the memory circuit of FIG. 1A.

FIG. 1B is a block diagram illustrating in different detail a portion of the memory circuit 100 of FIG. 1A. FIG. 1B illustrates that a typical memory circuit 100 includes multiple memory arrays, $ARRAY_0$, $ARRAY_1$, $ARRAY_2$, ..., $ARRAY_N$, accessed by numerous complementary pairs of digitlines, D and D*. The numerous digitlines, D and D,* further run to the multiple sense amplifiers $150_1$, $150_2$, $150_3$, ..., $150_N$, located in the sense amplifier gaps 151. FIG. 1B further illustrates peripheral circuit regions 160 to the memory circuit 100. In one embodiment, the peripheral circuit regions comprise such circuit device components as wordline drivers.

Figure 2A:
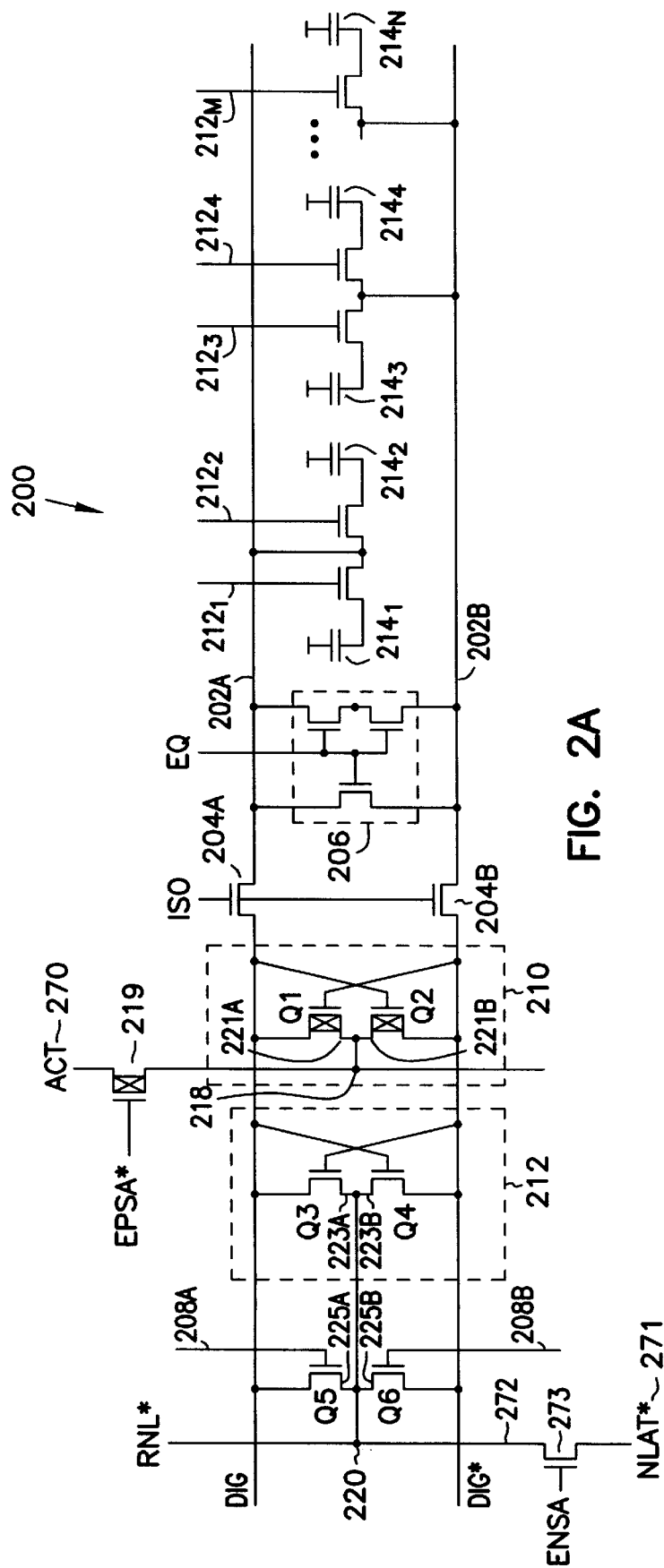
FIG. 2A is a schematic diagram illustrating in more detail a portion of an embodiment of a memory circuit according to the teachings of the present invention.

FIG. 2A is a schematic diagram illustrating in more detail a portion of an embodiment of a memory circuit according to the teachings of the present invention. FIG. 2A illustrates a pair of complementary digitlines, or bitlines 202A and 202B respectively. Specifically, FIG. 2A is a schematic diagram illustrating a detailed portion of a sense amplifier circuit and related auxiliary connection circuitry. In one embodiment, the detailed schematic 200 of FIG. 2A is included as a portion of the sense amplifier circuit 111 of FIG. 1. The schematic 200 of FIG. 2A includes standard features of a sense amplifier circuit including generally one or more isolation transistors shown as 204A and 204B respectively. The schematic 200 further includes an illustration of devices for digitline equilibration shown collectively as 206. The schematic 200 illustrates that an embodiment of the sense amplifier includes a p-sense amplifier 210, as well as an n-sense amplifier 212. The p-sense amplifier 210 includes a pair of p-channel transistors, Q1 and Q2 respectively. The p-channel transistors, Q1 and Q2, are cross-coupled. The n-sense amplifier 212 includes a pair, or first pair, of n-channel transistors, Q3 and Q4 respectively. The n-channel transistors are cross-coupled. The n-sense amplifier 212 and the p-sense amplifier 210 are further coupled to the complementary pair of bitlines, or digitlines 202A and 202B. FIG. 2A further shows an illustrative embodiment of memory cells, $214_1$, $214_2$, $214_3$, $214_4$, ..., $214_N$, etc., located at the intersection of digitlines 202A and 202B and wordlines $212_1$, $212_2$, $212_3$, $212_4$, ..., $212_M$, In an exemplary embodiment, the complementary digitlines 202A and 202B, and the single n-sense amplifier 212 and single p-sense amplifier 210 are just a representative sampling of the more detailed makeup comprising numerous complementary pairs of digitlines and multiple n and p-type sense amplifiers in a memory array such as 110 of FIG. 1A. One of ordinary skill in the art of integrated circuit technology will understand the same upon reading this disclosure. Further the variables M and N are dependent only on the size of the memory array 110.

FIG. 2A further illustrates another pair, or second pair, of n-channel transistors, Q5 and Q6. The second pair of transistors, Q5 and Q6, are coupled in parallel with the first pair of n-channel transistors, Q3 and Q4. The second pair, Q5 and Q6, is further coupled to the complementary pair of bitlines 202A and 202B respectively. A first common node 218 is coupled to the pair of p-channel transistors Q1 and Q2. In one embodiment, the common node or first common node 218 includes electrical coupling to an active pull-up (ACT) 270 or power voltage supply node through an enable p-sense amplifier (EPSA*) transistor 219. In one stage of the operational embodiment, the ACT 270 couples a Vcc voltage supply to the common node 218. In still other stages of the operational embodiment, the ACT 270 couples other bias to common node 218. Another common node, or second common node 220, is coupled to the first pair of n-channel transistors, Q3 and Q4. In one embodiment, the second common node 220 includes electrical coupling to an n-sense amplifier LATch (NLAT*) 271 through an n-sense amplifier bus line (RNL*) 272. In one stage of the operational embodiment, the NLAT* couples a ground bias to the common node 220. The coupling of the NLAT* bias to the common node is controlled by an enable n-sense amplifier (ENSA) transistor 273. In still other stages of the operational embodiment, the NLAT* couples other bias to common node 220.

In one embodiment, p-sense amplifier 210 has the first common node 218 coupled to a first source/drain region, 221A and 221B respectively, of the pair of p-channel transistors, Q1 and Q2. In an alternative embodiment, the first common node 218 is coupled to a p-sense amplifier 210 at a second source/drain region, 221A and 221B respectively, for the pair of p-channel transistors, Q1 and Q2. In one embodiment of the n-sense amplifier 212, the second common node 220 is coupled to a first source/drain region, 223A and 223B respectively, of the pair of n-channel transistors, Q3 and Q4. In an alternative embodiment, the second common node 220 is coupled to the n-sense amplifier 212 at a second source/drain region, 223A and 223B respectively, for the first pair of n-channel transistors, Q3 and Q4. In one exemplary embodiment of the present invention, a second common node 220 is further coupled to a first source/drain region, 225A and 225B respectively, for the second pair of n-channel transistors, Q5 and Q6, that are coupled in parallel with Q3 and Q4. Alternatively, the second common node 220 is further coupled to a second source/drain region, 225A and 225B respectively, for the second pair of n-channel transistors, Q5 and Q6. In one embodiment of the present invention, the widths of the first pair of n-channel transistors, Q3 and Q4, are greater than the widths of the second pair of n-channel transistors, Q5 and Q6. In other words, the second pair of n-channel transistors, Q5 and Q6, are smaller in size, in order to have less drive, than the first pair, Q3 and Q4. In the embodiment of the sense amplifier circuit 200 of FIG. 2, the gates 226A and 226B of the second pair of n-channel transistors, Q5 and Q6, are independently coupled to external bias, 208A and 208B.

Figure 2B:
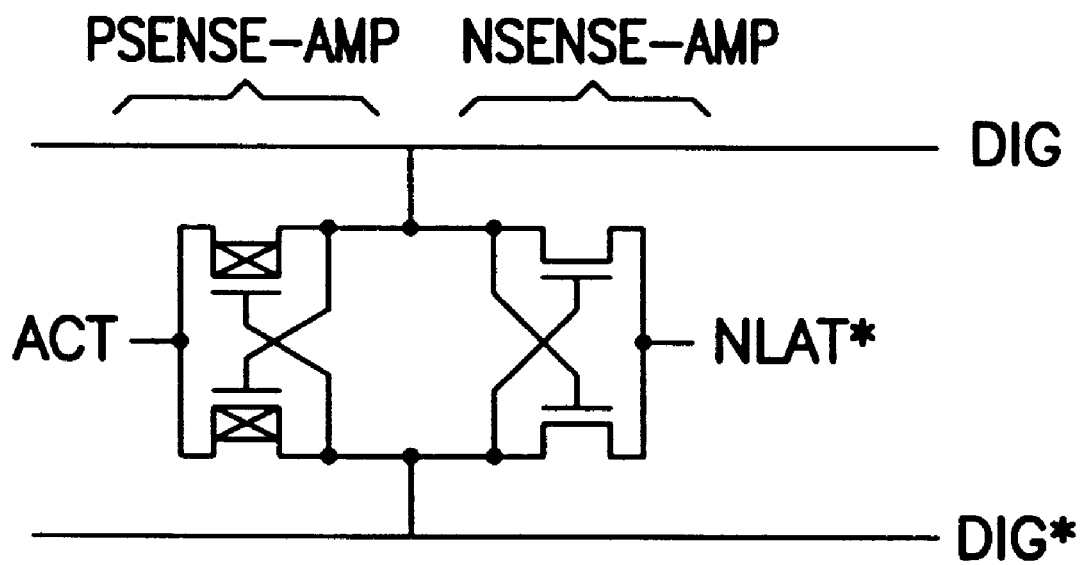
FIG. 2B presents a schematic diagram of a simplified sense amplifier suitable for detailing conventional sense amplifier operation.

FIG. 2B presents a schematic diagram of a simplified sense amplifier suitable for detailing conventional sense amplifier operation. Conventionally, a memory cell is read by raising the wordline to a voltage that is at least one transistor voltage threshold (Vt) above Vcc. The memory cell data is discharged onto the digitline (DIG). After the cell has been accessed, sensing occurs. Sensing is essentially the amplification of the digitline signal—the differential voltage between the selected digitline (DIG) and a reference digitline (DIG*). Sensing is necessary to properly read the memory cell data and to refresh the memory cells. FIG. 2B shows a cross-coupled n-channel metal-oxide semiconductor (nMOS) pair (n-sense amplifier) and a cross-coupled p-channel metal-oxide semiconductor (pMOS) pair (p-sense amplifier). The n- and p-sense amplifiers also appear like a pair of cross-coupled inverters in which ACT and NLAT* provide power and ground. The n-sense amplifier has a common node labeled NLAT* (for n-sense-amplifier LATch).

Similarly, the p-sense amplifier has a common node labeled ACT (for ACTive pull-up). Initially, NLAT* is biased to Vcc/2, and ACT is biased to Vss or signal ground. The digitline pair DIG and DIG* are both initially equilibrated at Vcc/2. As a result, the n-sense amplifier transistors are both off. Similarly, both p-sense amplifier transistors are off. When the memory cell is accessed, a signal develops across the complementary digitline pair, as stated in the previous paragraph. While one digitline contains charge from the cell access, the other digitline does not and serves as a reference for the sensing operation. The sense amplifiers are generally fired sequentially: the n-sense amplifier first, followed by the p-sense amplifier. Although designs vary at this point, the higher drive of nMOS transistors and better Vt matching provide for better sensing characteristics by n-sense amplifiers and lower probability of errors as compared to p-sense amplifiers.

The n-sense-amp is fired by bringing NLAT* toward ground. As the voltage difference between NLAT* and the digitlines approaches Vt, the nMOS transistor, in the cross-coupled nMOS pair, whose gate is connected to the higher voltage digitline begins to conduct. This conduction occurs first in the subthreshold region and then in the saturation region as the gate-to-source voltage exceeds Vt. This conduction causes the low-voltage digitline to be discharged toward the NLAT* voltage. Ultimately, NLAT* will reach ground, and the low-voltage digitline will be brought to ground potential. Note that the other nMOS transistor will not conduct: its gate voltage is now driven by the low-voltage digitline, which is being discharged toward ground. In reality, parasitic coupling between digitlines and limited subthreshold conduction by the second transistor results in some reduction in voltage on the high digitline.

Sometime after the n-sense amplifier fires, ACT will be brought toward Vcc and activate the p-sense amplifier, which operates in a complementary fashion to the n-sense amplifier. With the low-voltage digitline approaching ground, there is a strong signal to drive the appropriate pMOS transistor in the cross-coupled pMOS pair, into conduction. This conduction, again moving from subthreshold to saturation, charges the high-voltage digitline toward ACT, ultimately reaching Vcc. Because the memory cell transistor remains on, the memory cell capacitor is refreshed during the sensing operation. The voltage, and hence charge, which the memory cell capacitor held prior to accessing, is restored to a full level, e.g., in one exemplary embodimentVcc for a logic one and 0.0 Volts for a logic zero.

The operational embodiment of FIG. 2A operates in similar fashion to that described above, but with the additional inventive operational feature of the two small n-channel transistors coupled in parallel with the n-sense amplifier. In one operational embodiment of the present invention, the gates of the two small n-channel transistors are initially low. Then, depending on the intended direction for biasing the sense amplifier, the gate of one of the small n-channel transistors would go to Vcc/2, or DVC2, until the p-sense amplifier fires. Thus, the reference digitline (DIG) coupled with the fired small n-channel is pulled to ground harder, or assisted to ground faster, than the other digitline with the effect of enhancing a marginal or ambiguous voltage signal differential on the complementary pair of digitlines (DIG and DIG*). In result, a logical "1" read is favored. The biasing of the sense amplifier is set so that a zero can still be read out correctly. Where a detected signal voltage difference between the digitline (DIG) and the reference digitline (DIG*) is small, e.g., to the point where a normal sense amplifier will read either toward a logical "1" or a logical "0," the biasing will cause the sense amplifier to read a logical "1".

Figure 3A:
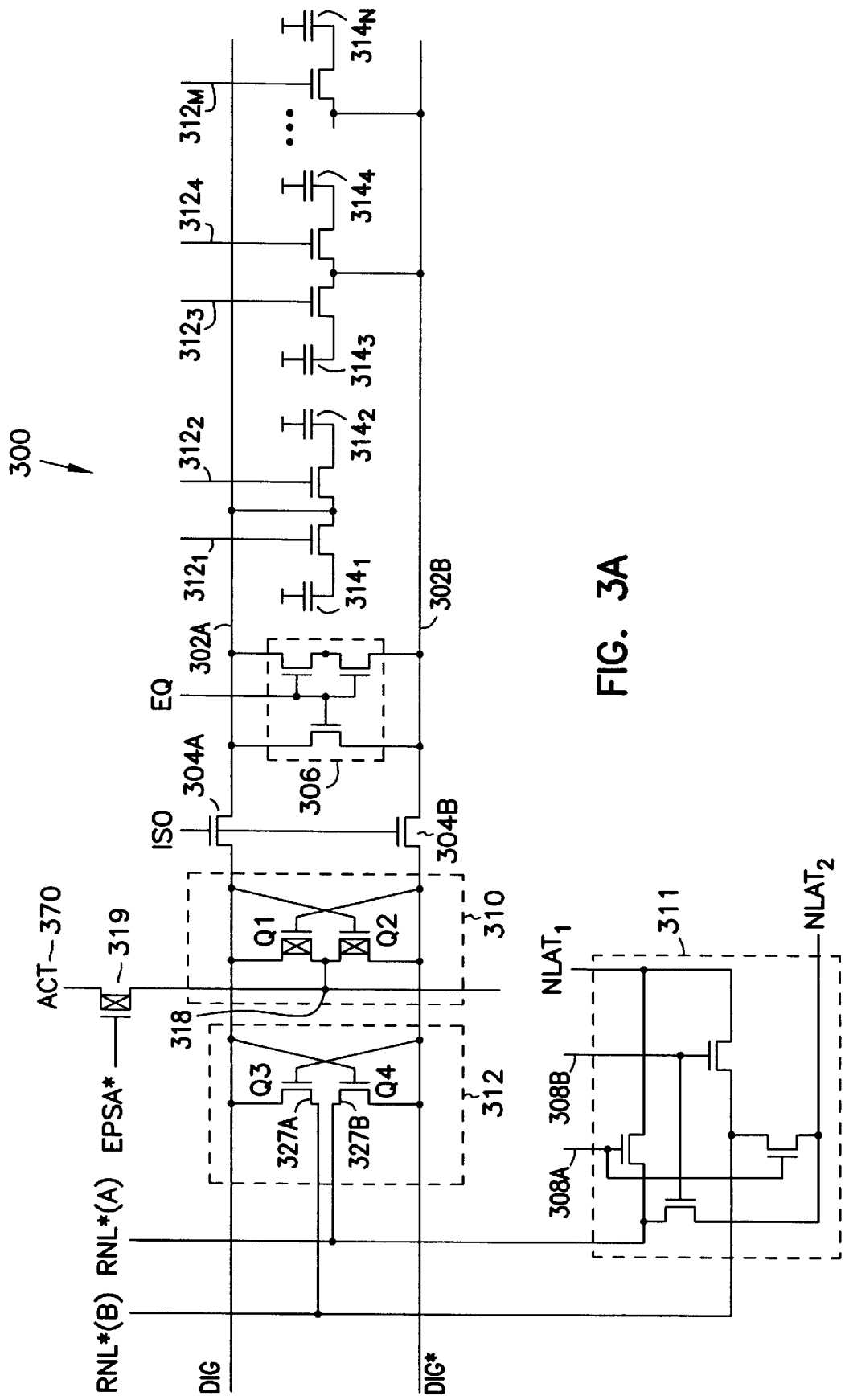
FIG. 3A is a schematic diagram illustrating in more detail a portion of another embodiment of a memory circuit according to the teachings of the present invention.

FIG. 3A is a schematic diagram illustrating in more detail a portion of an embodiment of a memory circuit according to the teachings of the present invention. FIG. 3A illustrates a pair of complementary digitlines, or bitlines 302A and 302B respectively. Specifically, FIG. 3A is a schematic diagram illustrating a detailed portion of a sense amplifier circuit and related auxiliary connection circuitry. In one embodiment, the detailed schematic 300 of FIG. 3A is included as a portion of the sense amplifier circuit 111 of FIG. 1. The schematic 300 of FIG. 3A includes standard features of a sense amplifier circuit including generally one or more isolation transistors shown as 304A and 304B respectively. The schematic 300 further includes an illustration of devices for digitline equilibration shown collectively as 306. The schematic 300 illustrates that an embodiment of the sense amplifier includes a p-sense amplifier 310, as well as an n-sense amplifier 312. The p-sense amplifier 310 includes a pair of p-channel transistors, Q1 and Q2 respectively. The p-channel transistors, Q1 and Q2, are cross-coupled. The n-sense transistor 312 includes a pair, or first pair, of n-channel transistors, Q3 and Q4 respectively. The n-sense amplifier 312 and the p-sense amplifier 310 are further coupled to the complementary pair of bit lines, or digitlines 302A and 302B respectively. FIG. 3A further shows an illustrative embodiment of memory cells, $314_1$, $314_2, 314_3, 314_4, \ldots, 314_N$, etc. located at the intersection of digitlines 302A and 302B and wordlines $312_1, 312_2, 312_3, 312_4, \ldots, 312_M$. In an exemplary embodiment, the complementary digitlines 302A and 302B, and the single n-sense amplifier 312 and single p-sense amplifier 310 are just a representative sampling of the more detailed makeup comprising numerous complementary pairs of digitlines, and multiple n and p-type sense amplifiers in a memory array such as 110 of FIG. 1A. One of ordinary skill in the art of integrated circuit technology will understand the same upon reading this disclosure. Further the variables M and N are dependent only on the size of the memory array 110.

A first common node 318 is coupled to the pair of p-channel transistors Q1 and Q2. In one embodiment, the common node or first common node 318 includes electrical coupling to an active pull-up (ACT) 370 or power voltage supply node through an enable p-sense amplifier (EPSA*) transistor 319. In one stage of the operational embodiment, the ACT 370 couples a Vcc voltage supply to the common node 318. In still other stages of the operational embodiment, the ACT 370 couples other bias to common node 318. In the exemplary embodiment of FIG. 3A, each n-channel transistor, Q3 and Q4, of the n-sense amplifier 312 has a first source/drain region, 327A and 327B, independently coupled to an n-sense amplifier bus line, RNL*A and RNL*B respectively. In an alternative embodiment, it is a second source/drain region, 327A and 327B, that is independently coupled to the n-sense amplifier bus line, RNL*A and RNL*B. In operation, the n-sense amplifier bus lines, RNL*A and RNL*B, couple each n-channel transistor, Q3 and Q4, to an n-sense amplifier LATch (NLAT*), $NLAT_1$ and $NLAT_2$.

The coupling of the $NLAT_1$ and $NLAT_2$ to each n-channel transistor, Q3 and Q4 is controlled by series of gate transistors shown collectively as 311. In one embodiment, the gate transistors are operated by bias, 308A and 308B. The bias, 308A and 308B, are applied in the alternative to one another in order to select which NLAT*, $NLAT_1$ or $NLAT_2$, gets coupled to which n-sense amplifier bus line, RNL*A or RNL*B. Thus, when bias 308A is on, bias 308B is off and vice versa. In the exemplary embodiment of FIG. 3A, applying bias 308A operates certain ones of the gate transistors 311, and couples $NLAT_1$ to RNL*A and $NLAT_2$ to RNL*B. Applying bias 308B has the opposite resultant effect. In one exemplary operational embodiment, $NLAT_1$ is at a potential of Vcc/2 (or DVC2) and $NLAT_2$ is at a potential of Vcc/2+ (or DVC2+), slightly greater than DVC2. In one exemplary embodiment of the present invention, DVC2+ is approximately 50 millivolts (mV) higher than the potential of DVC2. These potentials are placed on the respective n-sense amplifier bus lines, RNL*A or RNL*B depending on which bias, 308A or 308B, is selected.

Thus, in one exemplary operational embodiment, NLAT is at a potential of DVC2 and $NLAT_2$ is at a potential of DVC2+ when bias 308A is chosen. N-sense amplifier bus lines, RNL* is biased to DVC2 and RNL*B is biased to DVC2+. ACT 370 meanwhile is biased to Vss or signal ground. The digitline pair DIG and DIG* are both initially equilibrated at Vcc/2. Thus, the n-sense amplifier transistors are both off. Similarly, both p-sense amplifier transistors are off. When the memory cell is accessed, a signal develops across the complementary digitline pair, DIG and DIG*. While one digitline contains charge from the cell accessed, the other digitline does not and serves as a reference for the sensing operation.

In the next stage of an operational embodiment, the n-sense amplifier is fired by bringing, $NLAT_1$ and $NLAT_2$, toward ground. As the voltage difference between $NLAT_1$ and digitline DIG*, and between $NLAT_2$ and digitline DIG and approaches Vt, the n-channel transistor whose gate is connected to the higher voltage digitline begins to conduct. This conduction is further assisted, however, by the fact that $NLAT_1$ with the DVC2 bias will pull to ground more quickly, reaching that transistor's saturation conduction region more rapidly. Thus, even if the signal difference across the complementary digitline pair, DIG and DIG* is not very clear or distinguishable, one of the n-channel transistors will be biased to turn on more quickly, favoring a logical "1" read. The remainder of the sensing operation occurs as presented above in connection with FIG. 2B. The conduction of the n-channel transistor causes the low-voltage digitline to be discharged toward the NLAT* voltage. Ultimately, NLAT* will reach ground, and the digitline will be brought to ground potential. The p-sense amplifier is next fired and the ACT 370 will be brought toward Vcc in complementary fashion to the n-sense amplifier. With the low-voltage digitline approaching ground, there is a strong signal to drive the appropriate p-channel transistor into conduction.

Figure 3B:
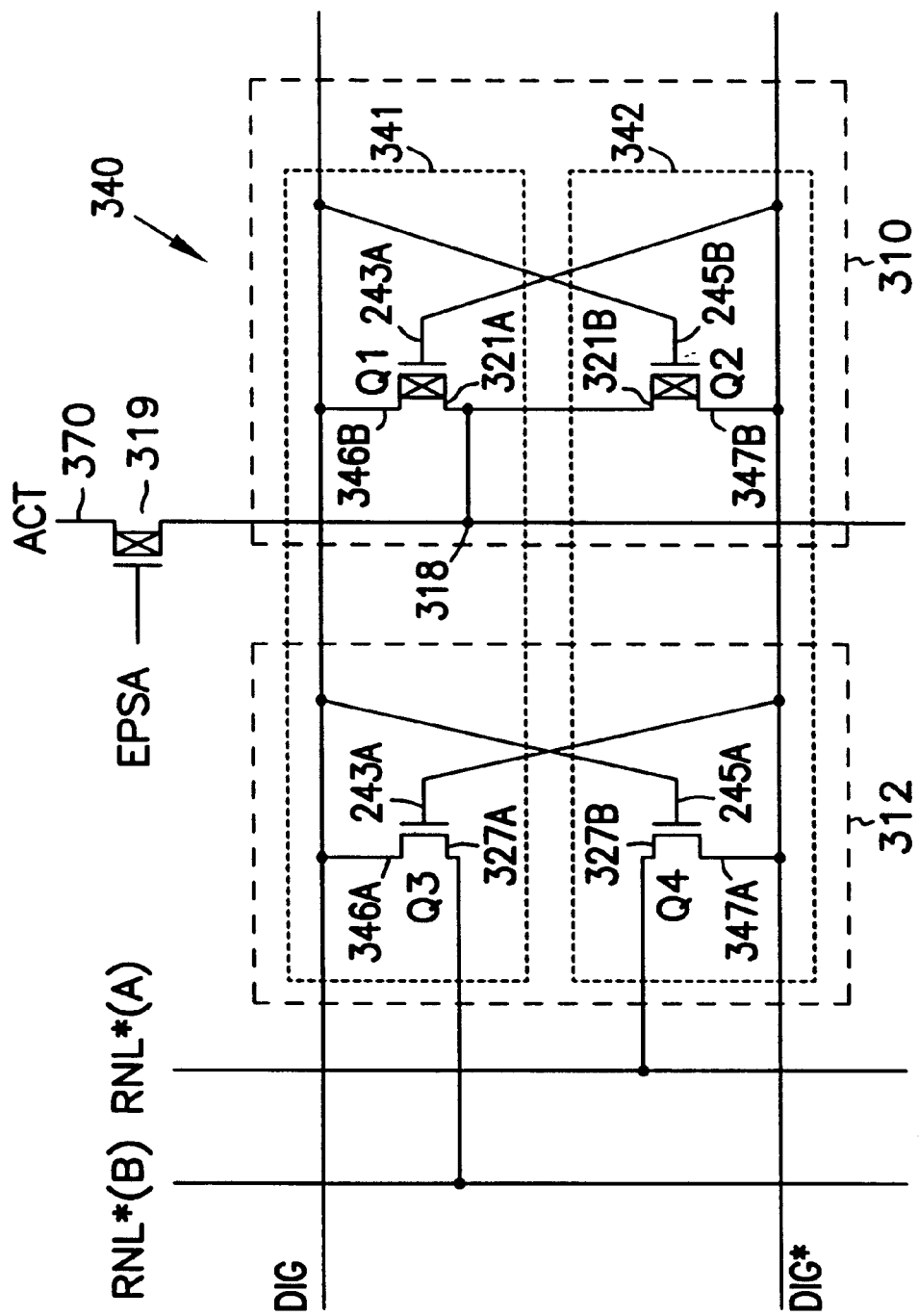
FIG. 3B is a schematic diagram illustrating in different detail a portion of sense amplifier and biasing portion of the schematic in FIG. 3A.

FIG. 3B is a schematic diagram illustrating in different detail a portion of sense amplifier and biasing portion of the schematic in FIG. 3A. The p-sense amplifier 310 and the n-sense amplifier 312 together form a pair of cross-coupled inverters shown collectively as 340. Individually, each inverter, 341 or 342, is made up of a first channel type field effect transistor (FET), Q1 or Q2, and a second channel type FET, Q3 or Q4. Thus, each inverter, 341 or 342, includes a complementary pair of field effect transistors, Q1 and Q3, or Q2 and Q4. In an exemplary embodiment, each one of the complementary digitlines, 302A and 302B, is coupled to the gates set, 343A and 343B, or set 345A and 345B, of one of the pair of cross-coupled inverters, 341 or 342. Also, each one of the complementary digitlines, 302A and 302B, is coupled to the drain regions set, 346A and 346B, or set 347A and 347B, of the other one of the pair of inverters, 341 or 342. In FIG. 3, a common node 318 is coupled to the source regions 321A and 321B of the first channel type FETs, Q1 and Q2, in each complementary pair of transistors, 341 and 342. In a further embodiment of the present invention, an independent external bias is coupled to the source regions, 327A and 327B, of the second channel type FETs, Q3 and Q4, in each of the complementary pair of transistors, 341 and 342. In one embodiment, the first channel type FET, Q1 or Q2, includes a p-channel FET and the second channel type FET, Q3 or Q4, includes an n-channel FET.

Figure 4:
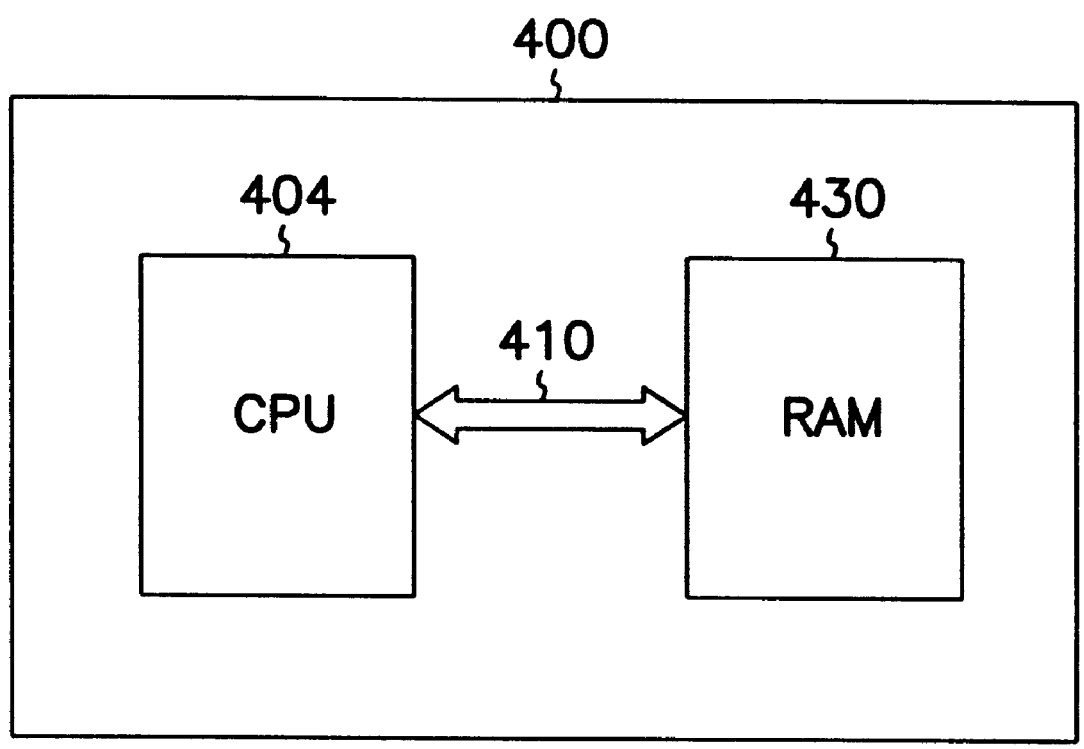
FIG. 4 is a block diagram illustrating an electronic system according to an embodiment of the present invention.

FIG. 4 is a block diagram illustrating an electronic system 400 according to an embodiment of the present invention. The electronic system includes a central processing unit (CPU) 404 coupled to a memory device 430. The memory device 430 includes the memory circuit 100 presented and described earlier in connection with FIG. 1. A system bus 410 communicatively couples the central processing unit (CPU) to the memory device 430.

Figure 5:
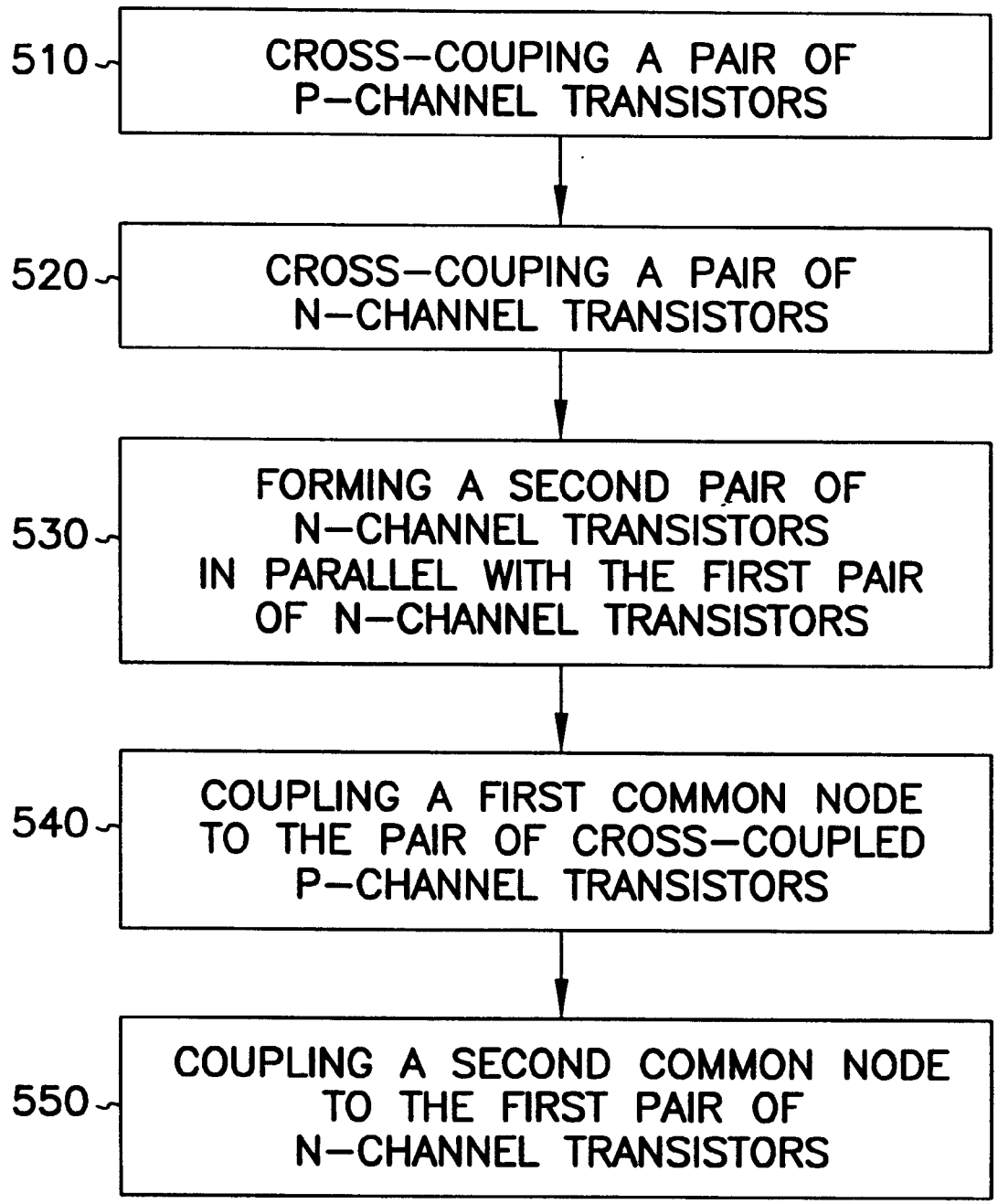
FIG. 5 illustrates, in flow diagram form, another methodical aspect for forming a sense amplifier circuit, according to the teachings of the present invention.

FIG. 5 illustrates, in flow diagram form, a methodical aspect for forming a current sense amplifier according to the teachings of the present invention. A pair of p-channel transistors are cross-coupled at 510. A first pair of n-channel transistors are cross-coupled at 520. Cross-coupling the p-channel pair and the first n-channel pair includes coupling the pairs to a complementary pair of bitlines. A second pair of n-channel transistors is formed in parallel with the first pair of n-channel transistors at 530. A first common node is coupled to the pair of cross-coupled p-channel transistors at 540. A second common node is coupled to a first pair of n-channel transistors at 550.

Figure 6:
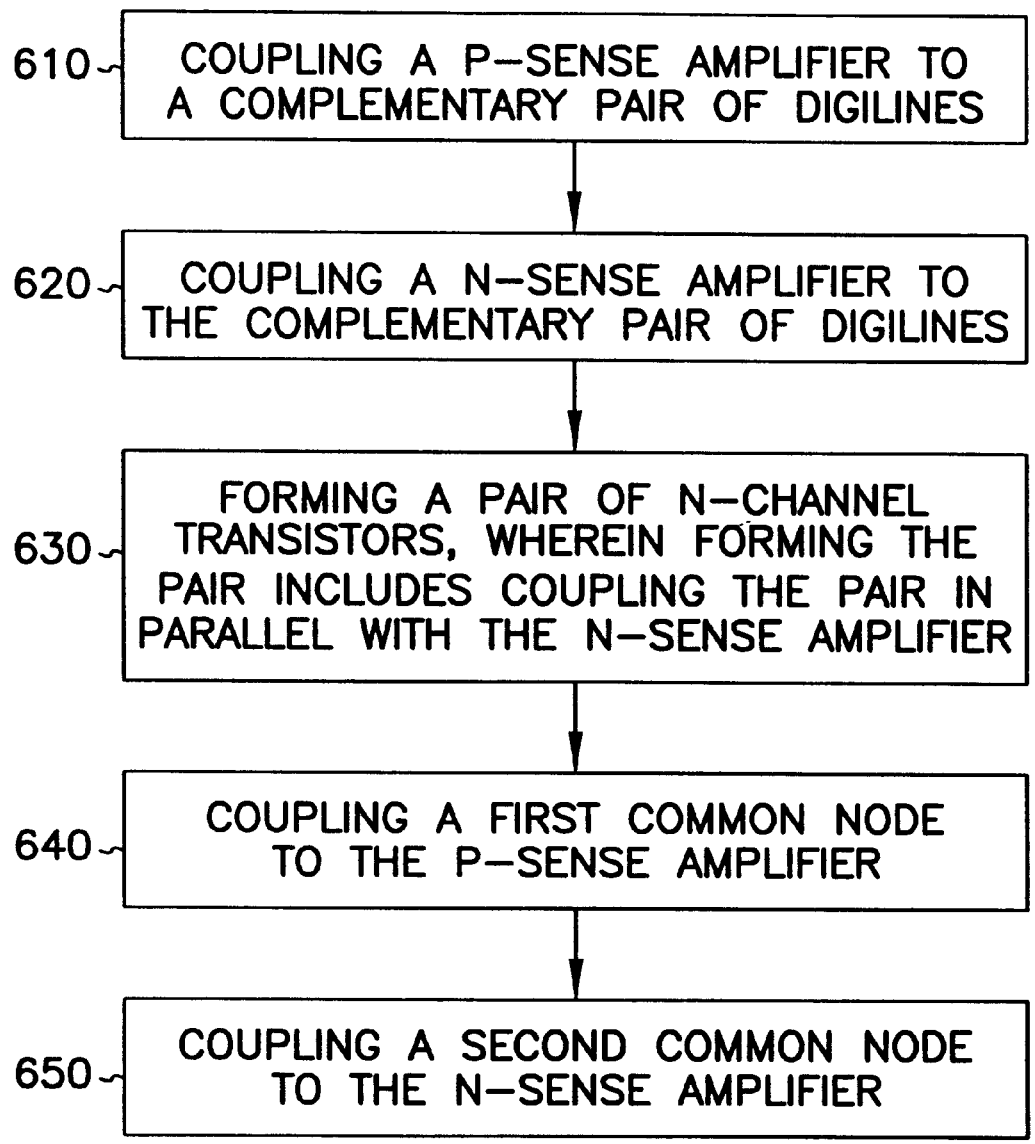
FIG. 6 illustrates, in flow diagram form, another methodical aspect for forming a sense amplifier circuit, according to the teachings of the present invention.

FIG. 6 illustrates, in flow diagram form, another methodical aspect for forming a sense amplifier circuit according to the teachings of the present invention. A p-sense amplifier is coupled to a complementary pair of digitlines at 610. An n-sense amplifier is coupled to the complementary pair of digitlines at 620. A pair of n-channel transistors are formed at 630. Forming the pair includes coupling the pair in parallel with the n-sense amplifier and forming the pair includes coupling the pair to the complementary pair of bitlines. A first common node is coupled to the p-sense amplifier at 640 and a second common node is coupled to the n-sense amplifier at 650.

Figure 7:
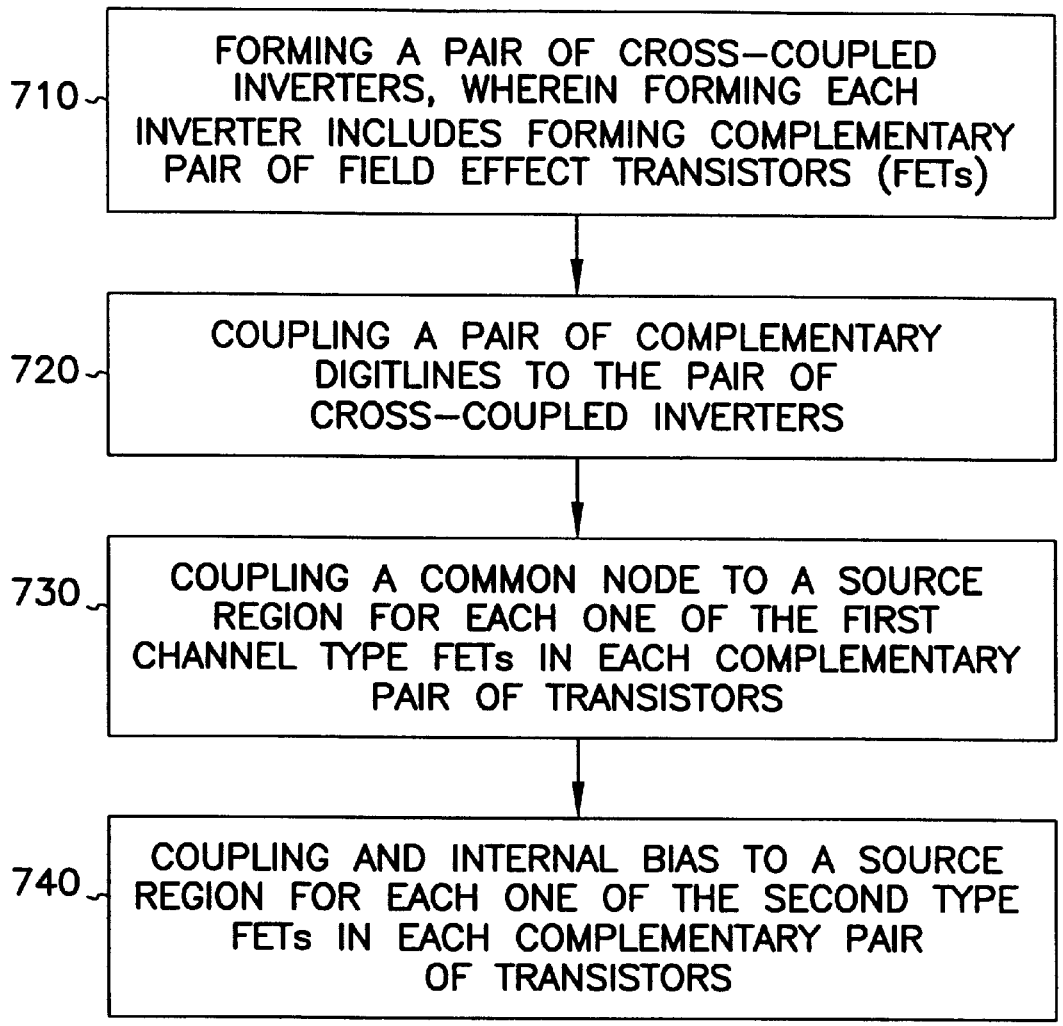
FIG. 7 illustrates, in flow diagram form, another methodical aspect for forming a sense amplifier circuit, according to the teachings of the present invention.

FIG. 7 illustrates, in flow diagram form, another methodical aspect for forming a sense amplifier circuit, according to the teachings of the present invention. A pair of cross-coupled inverters are formed at 710. Forming each inverter includes forming a complementary pair of field effect transistors (FETs). Forming the complementary pair includes coupling a first channel type FET with a second channel type FET. A pair of complementary digitlines is coupled to the pair of cross-coupled inverters at 720. Coupling the pair of complementary digitlines includes coupling each digitline to the gates of one of the pair of inverters and to the drain regions of the other one of the pair of inverters. A common node is coupled to a source/drain region for each one of the first channel type FETs in each of the complementary pair of transistors at 730 and independent external bias is coupled to a source region for each one of the second channel type FETs in each complementary pair of transistors at 740.

Figure 8:
FIG. 8 illustrates, in flow diagram form, a methodical embodiment for operating the present invention.

FIG. 8 illustrates, in common flow diagram form, a methodical embodiment for operating a sense amplifier according to the teachings of the present invention. At 810, the sense amplifier is biased to fire in one direction by biasing one of two small n-channel transistors which are coupled in parallel with a cross-coupled n-channel transistors of an n-sense amplifier.

Figure 9:
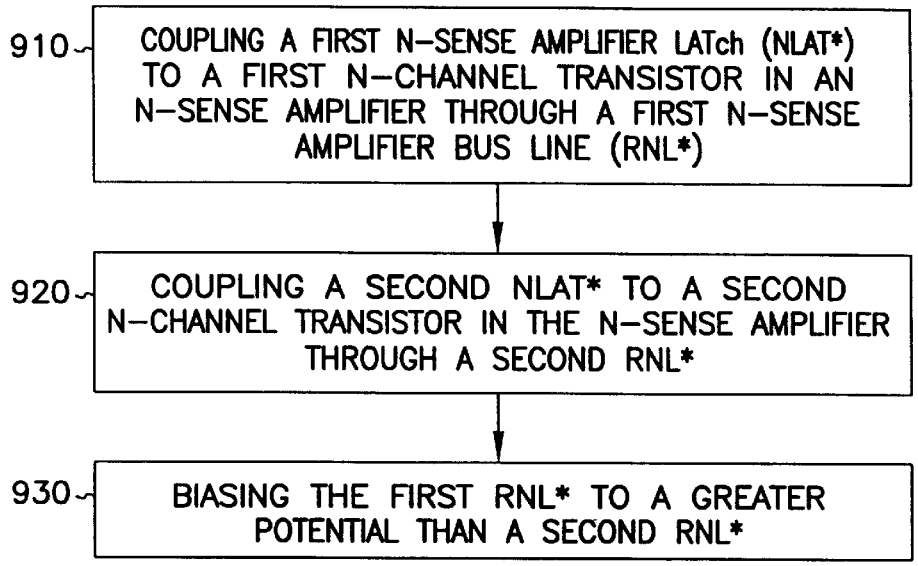
FIG. 9 illustrates, in flow diagram form, a methodical embodiment for operating the present invention.

FIG. 9 illustrates, in common flow diagram form, a methodical embodiment for operating a sense amplifier according to the teachings of the present invention. A separate n-sense-amplifier LATch (NLAT*) is coupled to each of the cross-coupled n-channel transistors in an n-sense amplifier through two separate bus lines (RNL*), RNL* (A) and RNL* (B), at 910. One of the separate bus lines, RNL* (A) or RNL* (B), is biased to ground harder than the other one of the separate bus lines, RNL* (A) or RNL* (B) at 920. Coupling each of the cross-coupled n-channel transistors in an n-sense amplifier through two separate bus lines (RNL*), RNL* (A) and RNL* (B) includes coupling to the two separate bus lines (RNL*), RNL* (A) and RNL* (B), to all of the sense amplifiers in an individual sense amplifier gap in a memory layout.

Figure 10:
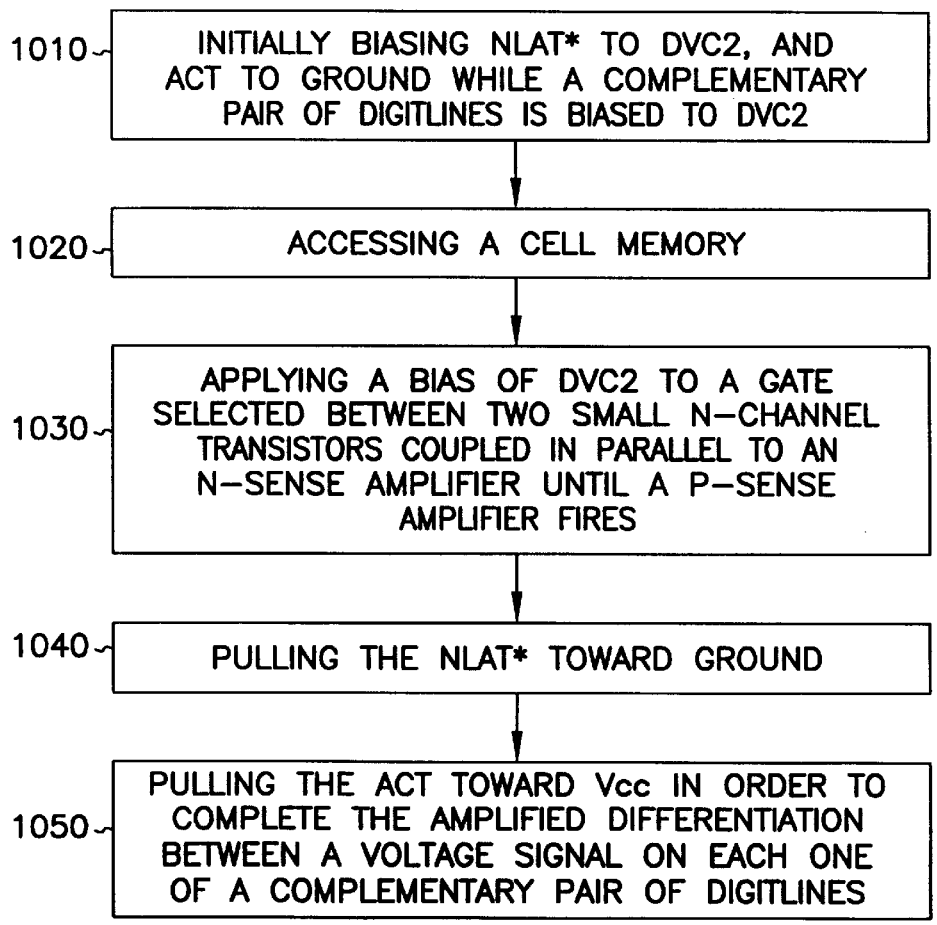
FIG. 10 illustrates, in flow diagram form, a methodical embodiment for operating the present invention.

FIG. 10 illustrates, in flow diagram form, a methodical embodiment for operating a sense amplifier, according to the present invention. A first common node, or NLAT*, is coupled to an n-sense amplifier, or first pair of n-channel transistors. A second common node, or ACT, is coupled to a p-sense amplifier, or pair of p-channel transistors. At 1010 NLAT* is initially biased to DVC2, ACT is initially biased to ground, and a complementary pair of digitlines, which are coupled to the n and p-sense amplifiers respectively, are biased to DVC2. A memory cell is accessed at 1020. At 1030, a bias of DVC2 is applied to one of the gates of two small n-channel transistors, which are coupled in parallel to the cross-coupled n-channel transistors of the n-sense amplifier, until the p-sense amplifier fires. The NLAT* is pulled toward ground at 1040. The ACT is pulled toward Vcc at 1050 in order to complete the amplified differentiation between a signal on each one of the complementary pair of digitlines.

Figure 11:
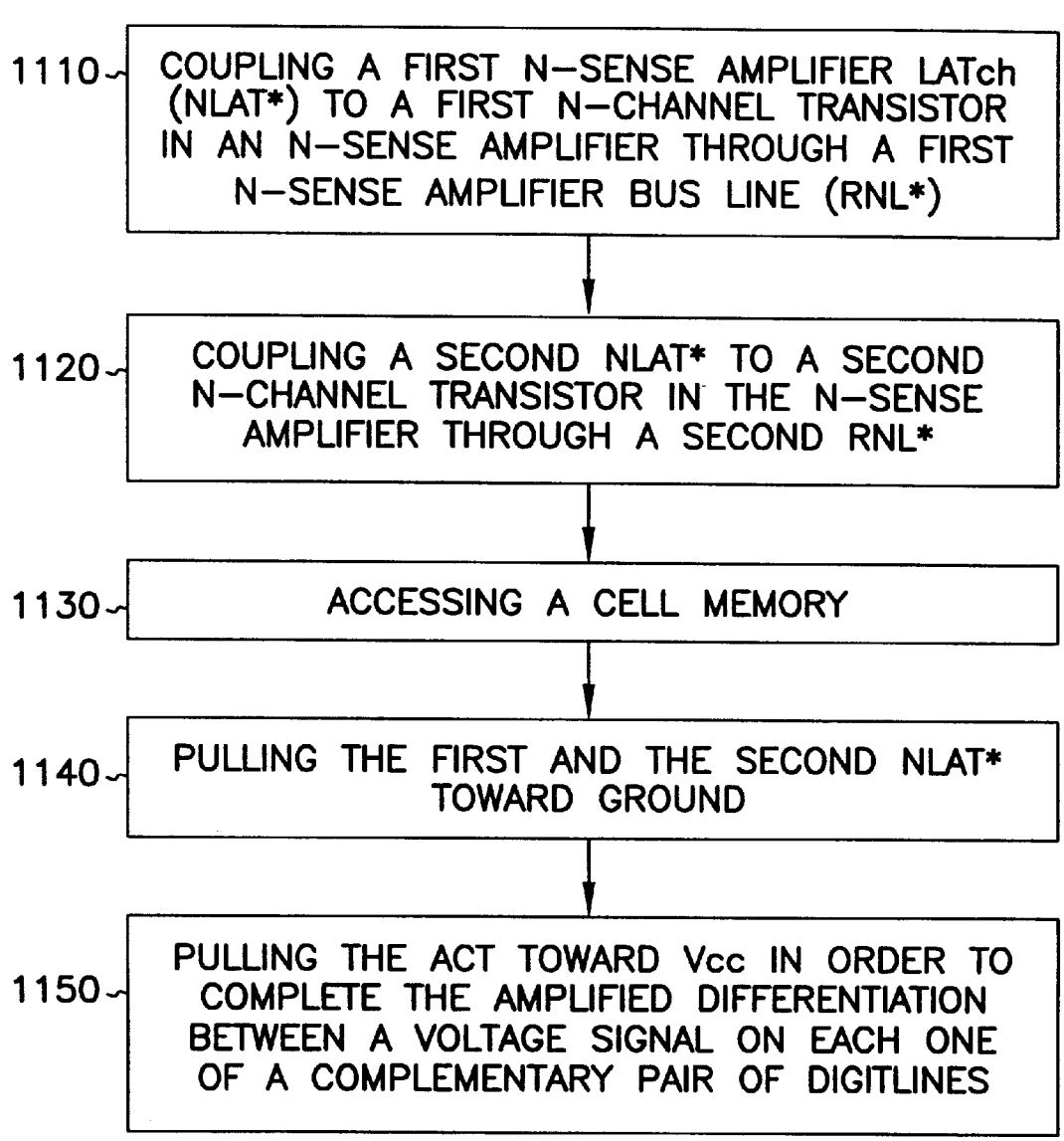
FIG. 11 illustrates, in flow diagram form, a methodical embodiment for reading a memory cell, according to the teachings of the present invention.

FIG. 11 illustrates, in flow diagram form, a methodical embodiment for reading a memory cell, according to the present invention. A separate n-sense-amplifier LATch (NLAT*) is coupled to each of the cross-coupled n-channel transistors in an n-sense amplifier through two separate bus lines (RNL*), RNL* (A) and RNL* (B), at 1110. A common node, or ACT, is coupled to a p-sense amplifier, or pair of p-channel transistors. At 1120, both NLAT*s are initially biased to DVC2, ACT is initially biased to ground, and a complementary pair of digitlines, which are coupled to the n and p-sense amplifiers respectively, are biased to DVC2. A memory cell is accessed at 1030. One of the separate bus lines, RNL* (A) or RNL* (B), is biased to ground harder than the other one of the separate bus lines, RNL* (A) or RNL* (B) at 1140. Coupling each of the cross-coupled n-channel transistors in an n-sense amplifier through two separate bus lines (RNL*), RNL* (A) and RNL* (B) includes coupling to the two separate bus lines (RNL*), RNL* (A) and RNL* (B), to all of the sense amplifiers in an individual sense amplifier gap in a memory layout. The ACT is pulled toward Vcc at 1050 in order to complete the amplified differentiation between a signal on each one of the complementary pair of digitlines. Biasing a first one of the two separate bus lines, RNL* (A) or RNL* (B), to ground harder than the other one of the separate bus lines, RNL* (A) or RNL* (B), includes biasing a first one of the separate bus lines, RNL* (A) or RNL* (B), to DVC2+ and the other one to DVC2.

CONCLUSION

A structure and method for improving the sense amplifier operation in memory circuits is provided. An illustrative embodiment of the present invention includes taking the predecoded the row address signals (i.e. RA123<n>, LPHe<n>, LPHo<n>) that run down the rowdriver seams in a memory array, decoding those address signals in the sense amplifier gaps to fire a signal that runs up the sense amplifier gap and biases the sense amplifier to fire in one direction or the other. Exemplary embodiments of the present invention are as follows. One method of the present invention includes putting two small n-channel transistors in parallel with each of the cross-coupled n-channel transistors in the n-sense amplifier. The gates of the two small n-channel transistors are initially low. Then, depending on the intended direction for biasing the sense amplifier, the gate of one of the small n-channel transistors would go to DVC2 until the p-sense amplifier fires. Thus, the reference digitline coupled in parallel with the fired small n-channel is pulled to ground harder, or assisted to ground faster, than the other digitline with the effect of favoring a "sensed" logical "1" on the latter. The biasing of the sense amplifier is set so that a zero can still be read out correctly. In result, where a detected signal voltage difference between the digitline (DIG) and the reference digitline (DIG*) is small, e.g., to the point where a normal sense amplifier will read either toward a logical "1" or a logical "0," the biasing will cause the sense amplifier to assume a logical "1" has been read.

A second method of the present invention includes using two separate n-sense amplifier bus lines (RNL*s) in each individual sense amplifier gap. One of the two separate n-sense amplifier bus lines (RNL*s) is connected to each of the two cross couple n-channel transistors in the n-sense amplifier. One of the two separate n-sense amplifier bus lines (RNL*s) is biased greater than the other which equilibrates the digitlines in such a manner as to favor sensing a logical "1" on the selected digitline. In an exemplary embodiment of six square features ($6F^2$) architecture with vertical twist, double twisted columns go to one sense amplifier gap and single twisted columns go to the other sense amplifier gap. Here every sense amplifier in a particular gap gets connected up the same way and only the local phase is needed to tell which digitline is getting the signal, or charge, and which is the reference digitline.

The improved structure and method provides a greater, or expanded, signal detection range for signifying a logical "1." In other words, the margin for detecting a logical "1," or "one's margin," improved. A margin, or portion, of the signal detecting range traditionally allotted for logical "0" is required to expand the "one's margin." The expanded logical "1" signal detection range allows the voltage level in the "sensed" cell to fall as far down as the digitline equilibrated value of Vcc/2 (also referred to as DVC2) before it will fail to read out as a logical "1." However, the accuracy of detecting a logical "0" is not significantly restricted.

Another notable advantage to the present invention is that favoring a logical "1" in the sensing operation requires less charge to store a logical "1" in a memory cell. This helps to reduce the negative effects of capacitive coupling between the digitlines and other memory cells in the memory array.

Still another advantage of the present invention is that the circuit design reduces memory cell charge leakage rate. To explain, logical "1's" do not normally leak away in a linear fashion. That is, as the voltage in the memory cell drops, the rate of leakage decreases. The improved sensing capability of the present invention allows a smaller voltage to be stored in individual memory cells and still obtain an accurate logical "1" detection. The slower rate of leakage in the DVC2 voltage range will also help improve, or increase, the logical "1s" refresh period. The refresh period is the amount of time between when a cell containing a logical "1" must be refreshed, to account for charge leakage. The required refresh period for a logical "0" on the typical cell is not affected much more than reading the zero with no refresh.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A sense amplifier circuit, comprising:
    a pair of p-channel transistors, wherein the p-channel transistors are cross-coupled;
    a pair of n-channel transistors, wherein the pair of n-channel transistors are cross-coupled, wherein a first source/drain region for each n-channel transistor of the n-channel pair is independently coupled to an external bias, and wherein the n-channel pair and the p-channel pair are further coupled to a complementary pair of bitlines; and
    a common node coupled to the pair of cross-coupled p-channel transistors.

2. The sense amplifier circuit of claim 1, wherein the common node is coupled to a first source/drain region of the pair of p-channel transistors.

3. The sense amplifier circuit of claim 1, wherein a second source/drain of the pair of p-channel transistors is coupled to the complementary pair of bitlines.

4. The sense amplifier circuit of claim 1, wherein a second source/drain region of the pair of n-channel transistors is coupled to the complementary pair of bitlines.

5. The sense amplifier circuit of claim 1, wherein the first source/drain region for one of the pair of n-channel transistors is independently coupled to a DVC2+ bias, and wherein the first source/drain region for the other one of the pair of n-channel transistors is independently coupled to a DVC2 bias.

6. The sense amplifier circuit of claim 5, wherein the DVC2+ bias is approximately 50 millivolts (mV) greater than the DVC2 bias.

7. A sense amplifier circuit, comprising:
    a pair of cross coupled inverters, wherein each inverter includes a complementary pair of field effect transistors (FETs), the complementary pair comprising a first channel type FET and a second channel type FET;
    a pair of complementary digitlines, wherein each digitline is coupled to the gates of one of the pair of cross coupled inverters and to the drain regions of the other one of the pair of inverters;
    a common node coupled to the source region of the first channel type FET in each complementary pair of transistors; and
    an independent external bias coupled to the source region of the second channel type FET in each complementary pair of transistors.

8. The sense amplifier circuit of claim 7, wherein the first channel type FET includes a p-channel FET, and the second channel type FET includes an n-channel FET.

9. The sense amplifier circuit of claim 7, wherein a first one of the independent external bias includes a bias of DVC2, and wherein a second one of the independent external bias includes a bias of DVC2+.

10. The sense amplifier circuit of claim 9, wherein the DVC+ bias is approximately 50 millivolts (mV) greater than the DVC2 bias.

11. A sense amplifier circuit, comprising:
 a pair of p-channel transistors, wherein the p-channel transistors are cross-coupled;
 a pair of n-channel transistors, wherein the pair of n-channel transistors are cross-coupled, wherein a first source/drain region for one of the pair of n-channel transistors is independently coupled to a DVC2+ bias, and wherein a first source/drain region for the other one of the pair of n-channel transistors is independently coupled to a DVC2 bias, and wherein the n-channel pair and the p-channel pair are further coupled to a complementary pair of bitlines; and
 a common node coupled to a first source/drain region of the pair of p-channel transistors.

12. The sense amplifier circuit of claim 11, wherein the DVC2+ bias is approximately 50 millivolts (mV) greater than the DVC2 bias.

13. A memory circuit, comprising:
 a memory array, the memory array having multiple rows of wordlines and multiple columns of bitlines, the intersection of the multiple rows of wordlines and multiple columns of bitlines comprising multiple memory cells;
 a sense amplifier circuit coupled to the memory array, wherein the sense amplifier circuit further comprises:
  a pair of p-channel transistors, wherein the p-channel transistors are cross-coupled;
  a pair of n-channel transistors, wherein the pair of n-channel transistors are cross-coupled, wherein a first source/drain region for each n-channel transistor of the n-channel pair is independently coupled to an external bias, and wherein the n-channel pair and the p-channel pair are further coupled to a complementary pair of bitlines; and
  a common node coupled to the pair of cross-coupled p-channel transistors;
 a column decoder coupled to the sense amplifier circuit;
 a row decoder coupled to the multiple rows of wordlines;
 a number of input/output (I/O) lines coupled to the number of bitlines through an I/O control circuit block to the sense amplifier circuit; and
 a control circuit, wherein the control circuit couples to the column decoder the sense amplifier circuit, and the row decoder.

14. The memory circuit of claim 13, wherein the common node is coupled to a first source/drain region of the pair of p-channel transistors.

15. The memory circuit of claim 13, wherein the first source/drain region for one of the pair of n-channel transistors is independently coupled to a DVC2+ bias, and wherein the first source/drain region for the other one of the pair of n-channel transistors is independently coupled to a DVC2 bias.

16. The memory circuit of claim 15, wherein the DVC2+ bias is approximately 50 millivolts (mV) greater than the DVC2 bias.

17. The memory circuit of claim 13, where the memory circuit includes an eight square features ($8F^2$) memory cell layout architecture.

18. The memory circuit of claim 13, where the memory circuit includes a six square features ($6F^2$) memory cell layout architecture.

19. An electronic system, comprising:
 a central processing unit;
 a memory device, the memory device further comprising:
  a memory array, the memory array having multiple rows of wordlines and multiple columns of bitlines, the intersection of the multiple rows of wordlines and multiple columns of bitlines comprising multiple memory cells;
  a sense amplifier circuit coupled to the memory array, wherein the sense amplifier circuit further comprises:
   a pair of p-channel transistors, wherein the p-channel transistors are cross-coupled;
   a pair of n-channel transistors, wherein the pair of n-channel transistors are cross-coupled, wherein a first source/drain region for each n-channel transistor of the n-channel pair is independently coupled to an external bias, and wherein the n-channel pair and the p-channel pair are further coupled to a complementary pair of bitlines; and
   a common node coupled to the pair of cross-coupled p-channel transistors;
  a column decoder coupled to the sense amplifier circuit;
  a row decoder coupled to the multiple rows of wordlines;
  a number of input/output (I/O) lines coupled to the multiple columns of bitlines through an I/O control circuit block to the sense amplifier circuit; and
  a control circuit, wherein the control circuit couples to the column decoder the sense amplifier circuit, and the row decoder; and
 a system bus for communicatively coupling the central processing unit and the memory device.

20. The electronic system of claim 19, wherein the common node is coupled to a first source/drain region of the pair of p-channel transistors.

21. The electronic system of claim 19, wherein a second source/drain of the pair of p-channel transistors is coupled to the complementary pair of bitlines.

22. The electronic system of claim 21, wherein the first source/drain region for one of the pair of n-channel transistors is independently coupled to a DVC2+ bias, and wherein the first source/drain region for the other one of the pair of n-channel transistors is independently coupled to a DVC2 bias.

23. A method of forming a current sense amplifier, comprising:
 cross-coupling a pair of p-channel transistors;
 cross-coupling a pair of n-channel transistors, wherein cross-coupling the first n-channel pair and cross-coupling the p-channel pair includes independently coupling a first source/drain region for each n-channel transistor of the n-channel pair to an external bias, and includes coupling the first n-channel pair and the p-channel pair to a complementary pair of bitlines; and
 coupling a common node to the pair of cross-coupled p-channel transistors.

24. The method of claim 23, wherein coupling a common node to the pair of cross-coupled p-channel transistors includes coupling the common node to a first source/drain region for each p-channel transistor in the pair of p-channel transistors.

25. The method of claim 23, wherein the method further includes coupling each one of pair of second source/drain regions of the pair of p-channel transistors to each one of the complementary pair of bitlines.

26. The method of claim 23, wherein the method further includes coupling each one of a pair of second source/drain regions in the pair of n-channel transistors to each one of the complementary pair of bitlines.

27. The method of claim 23, wherein independently coupling the first source/drain region for each n-channel transistor of the n-channel pair includes independently coupling the first source/drain region for one of the pair of n-channel transistors to a DVC2+ bias, and includes independently coupling the first source/drain region for the other one of the pair of n-channel transistors to a DVC2 bias.

28. The method of claim 27, wherein independently coupling the first source/drain region for one of the pair of n-channel transistors to a DVC2+ bias includes coupling to a bias which is approximately 50 millivolts (mV) greater than the bias coupled to the other one of the pair of n-channel transistors.

29. A method for forming a sense amplifier circuit, comprising:

forming a pair of cross-coupled inverters, wherein forming each inverter includes forming a complementary pair of field effect transistors (FETs), and wherein forming the complementary pair includes coupling a first channel type FET and a second channel type FET;

coupling a pair of complementary digitlines to the pair of cross-coupled inverters, wherein coupling the pair of complementary digitlines includes coupling each digitline to the gates of one of the pair of inverters and to the drain regions of the other one of the pair of inverters;

coupling a common node to a source region for each one of the first channel type FETs in each complementary pair of transistors; and coupling an independent external bias to a source region for each one of the second channel type FETs in each complementary pair of transistors.

30. The method of claim 29, wherein coupling a common node to a source region for each one of the first channel type FETs includes coupling to a p-channel FET, and wherein coupling an independent external bias to a source region for each one of the second channel type FETs includes coupling to an n-channel FET.

31. The method of claim 29, wherein coupling an independent external bias to a source region for each one of the second channel type FETs includes coupling one source region to a bias of DVC2, and includes coupling the other source region to a bias of DVC2+.

32. The method of claim 29, wherein coupling to a bias of DVC2+ includes coupling to a bias which is approximately 50 millivolts (mV) greater than a DVC2 bias.

* * * * *

UNITED STATES PATENT AND TRADEMARK OFFICE
CERTIFICATE OF CORRECTION

PATENT NO.: 6,075,737
DATED: June 13, 2000
INVENTOR(S): Mullarkey et al.

It is certified that error appears in the above-identified patent and that said Letters Patent is hereby corrected as shown below:

In column 15, line 2, claim 10, delete "DVC+" and insert --DVC+2--, therefore.
In column 1, line 65, delete "30 Vcc/2" and insert --+Vcc/2--, therefore.

Signed and Sealed this

Twenty-second Day of May, 2001

*Attest:*

NICHOLAS P. GODICI

*Attesting Officer*     *Acting Director of the United States Patent and Trademark Office*